(12) United States Patent  
Kim et al.

(10) Patent No.: US 9,406,908 B2
(45) Date of Patent: Aug. 2, 2016

(54) ORGANIC LIGHT EMITTING DEVICE (71) Applicant: LG DISPLAY CO., LTD., Seoul (KR)

(72) Inventors: Shinhan Kim, Seoul (KR); JeongHaeng Heo, Paju-si (KR); Taeshick Kim, Yongin-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/316,169

(22) Filed: Jun. 26, 2014

(65) Prior Publication Data

US 2015/0001506 A1    Jan. 1, 2015

(30) Foreign Application Priority Data

Jun. 28, 2013  (KR) .................. 10-2013-0075844

(51) Int. Cl.
*H01L 51/52* (2006.01)
*H01L 51/50* (2006.01)
*H01L 27/32* (2006.01)

(52) U.S. Cl.
CPC ........ *H01L 51/5278* (2013.01); *H01L 27/3209* (2013.01); *H01L 51/5044* (2013.01)

(58) Field of Classification Search
CPC ................................... H01L 51/5278
USPC ........................................... 257/40
See application file for complete search history.

(56) References Cited

U.S. PATENT DOCUMENTS

| 2006/0134460 | A1 | 6/2006 | Kondakova et al. |
| 2011/0057179 | A1 | 3/2011 | Nowatari et al. |
| 2012/0217515 | A1* | 8/2012 | Yamazaki ........... H01L 27/1225 257/88 |
| 2012/0248971 | A1 | 10/2012 | Okuyama |
| 2013/0069073 | A1 | 3/2013 | Song et al. |

FOREIGN PATENT DOCUMENTS

| CN | 101128559 A | 2/2008 |
| CN | 101859879 A | 10/2010 |
| CN | 102484922 A | 5/2012 |
| CN | 102903854 A | 1/2013 |
| CN | 103022363 A | 4/2013 |
| TW | 201248283 A1 | 12/2012 |

* cited by examiner

*Primary Examiner* — Edward Wojciechowicz
(74) *Attorney, Agent, or Firm* — Dentons US LLP (57) ABSTRACT

Disclosed is an organic light emitting device comprising an anode; a cathode; and a plurality of stacks formed between the anode and the cathode. The plurality of stacks respectively emit their respective light of colors different from one another, wherein the plurality of stacks include a stack emitting blue light and a stack emitting mixed light of blue light and yellow-green to red light. Because the organic light emitting device includes a stack emitting blue light and a stack emitting mixed light of yellow-green to red light and blue light, blue light having a relatively low efficiency may be emitted from the two stacks, whereby overall light emitting efficiency is improved.

13 Claims, 6 Drawing Sheets

FIG. 1

Related Art

FIG. 2

Related Art

ORGANIC LIGHT EMITTING DEVICE

CROSS REFERENCE TO RELATED APPLICATIONS

This application claims the benefit of the Korean Patent Application No. 10-2013-0075844 filed on Jun. 28, 2013, which is hereby incorporated by reference for all purposes as if fully set forth herein.

BACKGROUND

1. Field of the Disclosure

The present invention relates to an organic light emitting device, and more particularly, to an organic light emitting device that emits white light.

2. Discussion of the Related Art

An organic light emitting device has a structure that an organic light emitting portion is formed between a cathode and an anode, wherein electrons are injected into the cathode, and holes are injected into the anode. If the electrons generated in the cathode and the holes generated in the anode are injected into the organic light emitting portion, an exciton is generated by combination of the injected electrons and holes, and then the generated exciton is transited from the excited state to a ground state, whereby a light photon is emitted.

Such an organic light emitting device may be used as a back light of a liquid crystal display device, an organic light emitting display device, or in general lighting. Particularly, an organic light emitting device that emits white light may be combined with color filters and used as a full color display device.

A full color display device can be created by combining a color filter with a white organic light emitting device. The organic light emitting device emitting white light may be manufactured using a deposition process for each pixel. It is advantageous in that the process may be performed without a shadow mask. When the organic light emitting device has a red pixel including a red emitting layer, a green pixel including a green emitting layer, and a blue pixel including a blue emitting layer, it is necessary to make a pattern of each emitting layer with a shadow mask. However, when the organic light emitting device has a red pixel including a white emitting layer and a red color filter, a green pixel including a white emitting layer and a green color filter, and a blue pixel including a white emitting layer and a blue color filter, it is not necessary to make a pattern of each emitting layer, thereby making it possible to perform the process without a shadow mask.

Hereinafter, an organic light emitting device emitting white light according to the related art will be described with reference to the accompanying drawings.

Figure 1:
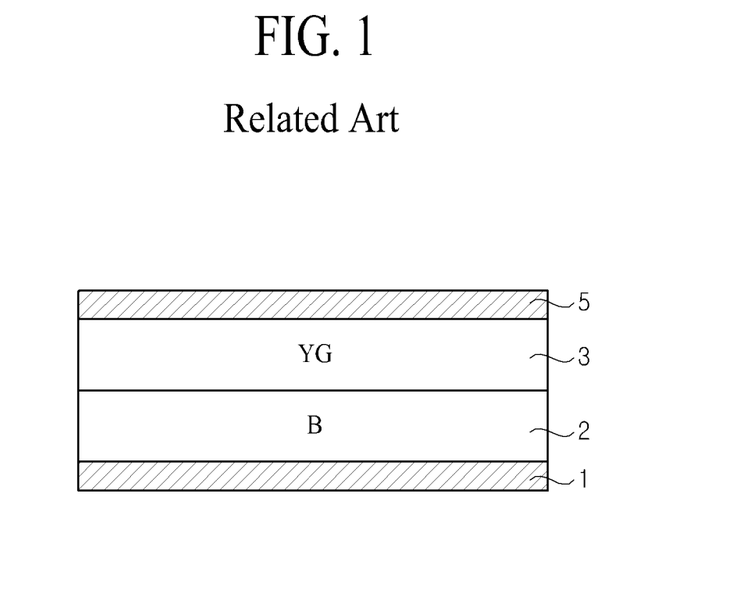
FIG. 1 is a cross-sectional view illustrating an organic light emitting device according to one embodiment of the related art.

FIG. 1 is a cross-sectional view illustrating an organic light emitting device according to the related art.

As shown in FIG. 1, the organic light emitting device according to the related art includes an anode 1, a first stack 2, a second stack 3, and a cathode 5.

The first stack 2 is formed on the anode 1 to emit blue (B) light. Although not shown in detail, the first stack 2 includes a light emitting layer emitting blue (B) light, a hole transporting layer for transporting holes to the light emitting layer, and an electron transporting layer for transporting electrons to the light emitting layer.

The second stack 3 is formed between the first stack 2 and the cathode 5 to emit yellow-green (YG) light. Similar to the first stack 2, the second stack 3 includes a light emitting layer for emitting yellow-green (YG) light, a hole transporting layer for transporting holes to the light emitting layer, and an electron transporting layer for transporting electrons to the light emitting layer.

The aforementioned organic light emitting device according to the related art emits white light by mixing blue light emitted from the first stack 2 with yellow-green light emitted from the second stack 3.

Figure 2:
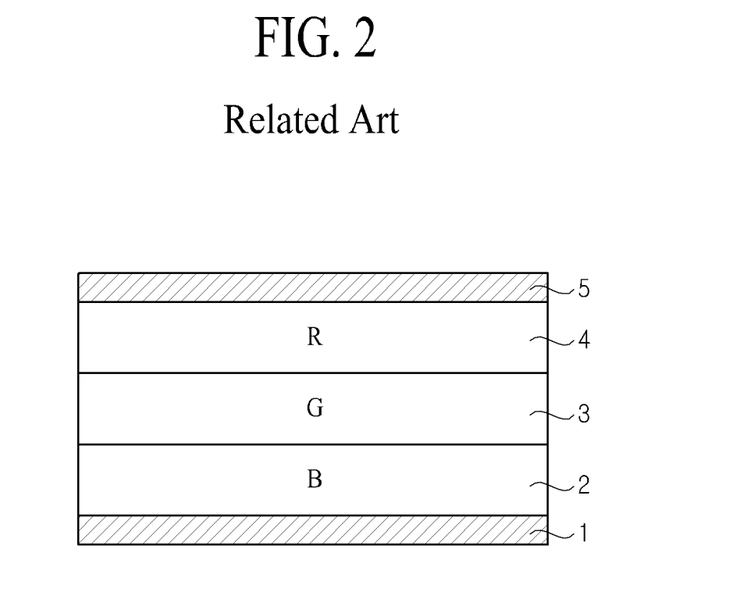
FIG. 2 is a cross-sectional view illustrating an organic light emitting device according to another embodiment of the related art.

FIG. 2 is a cross-sectional view illustrating an organic light emitting device according to another embodiment of the related art.

As shown in FIG. 2, the organic light emitting device according to another embodiment of the related art includes an anode 1, a first stack 2, a second stack 3, a third stack 4, and a cathode 5.

The first stack 2 is formed on the anode 1 to emit blue (B) light. Although not shown in detail, the first stack 2 includes a light emitting layer for emitting blue (B) light, a hole transporting layer for transporting holes to the light emitting layer, and an electron transporting layer for transporting electrons to the light emitting layer.

The second stack 3 is formed on the first stack 2 to emit green (G) light. Similarly to the first stack 2, the second stack 3 includes a light emitting layer for emitting green (G) light, a hole transporting layer for transporting holes to the light emitting layer, and an electron transporting layer for transporting electrons to the light emitting layer.

The third stack 4 is formed between the second stack 3 and the cathode 5 to emit red (R) light. Similarly to the first stack 2, the third stack 4 includes a light emitting layer for emitting red light, a hole transporting layer for transporting holes to the light emitting layer, and an electron transporting layer for transporting electrons to the light emitting layer.

The aforementioned organic light emitting device according to this embodiment of the related art emits white light by mixing blue (B) light emitted from the first stack 2, green (G) light emitted from the second stack 3, and red (R) light emitted from the third stack 4 with one another.

However, the aforementioned organic light emitting devices according to the embodiments of the related art have a problem in that light emitting efficiency is low. Particularly, a problem occurs in that overall light emitting efficiency is lowered because of low efficiency of blue (B) light.

SUMMARY

Accordingly, the present disclosure is directed to an organic light emitting device that substantially obviates one or more problems due to limitations and disadvantages of the related art.

An advantage of the present invention is to provide an organic light emitting device that may improve light emitting efficiency.

Additional advantages and features of the invention will be set forth in part in the description which follows and in part will become apparent to those having ordinary skill in the art upon examination of the following or may be learned from practice of the invention. These and other advantages of the invention may be realized and attained by the structure particularly pointed out in the written description and claims hereof as well as the appended drawings.

To achieve these other advantages and in accordance with the purpose of the invention, as embodied and broadly described herein, an organic light emitting device comprises an anode; a cathode; and a plurality of stacks formed between the anode and the cathode, the plurality of stacks respectively emitting their respective light of colors different from one another, wherein the plurality of stacks include a stack emitting blue light and a stack emitting mixed light of blue light and yellow-green to red light.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Reference will now be made in detail to the exemplary embodiments of the present invention, examples of which are illustrated in the accompanying drawings. Wherever possible, the same reference numbers will be used throughout the drawings to refer to the same or like parts.

The terminology "on" disclosed in this specification means that an element is formed directly on another element and moreover a third element is interposed between these elements.

The terminologies such as "first" and "second" disclosed in this specification do not mean the order of corresponding elements and are intended to identify the corresponding elements from each other.

Hereinafter, the preferred embodiments of the present invention will be described with reference to the accompanying drawings.

Figure 3:
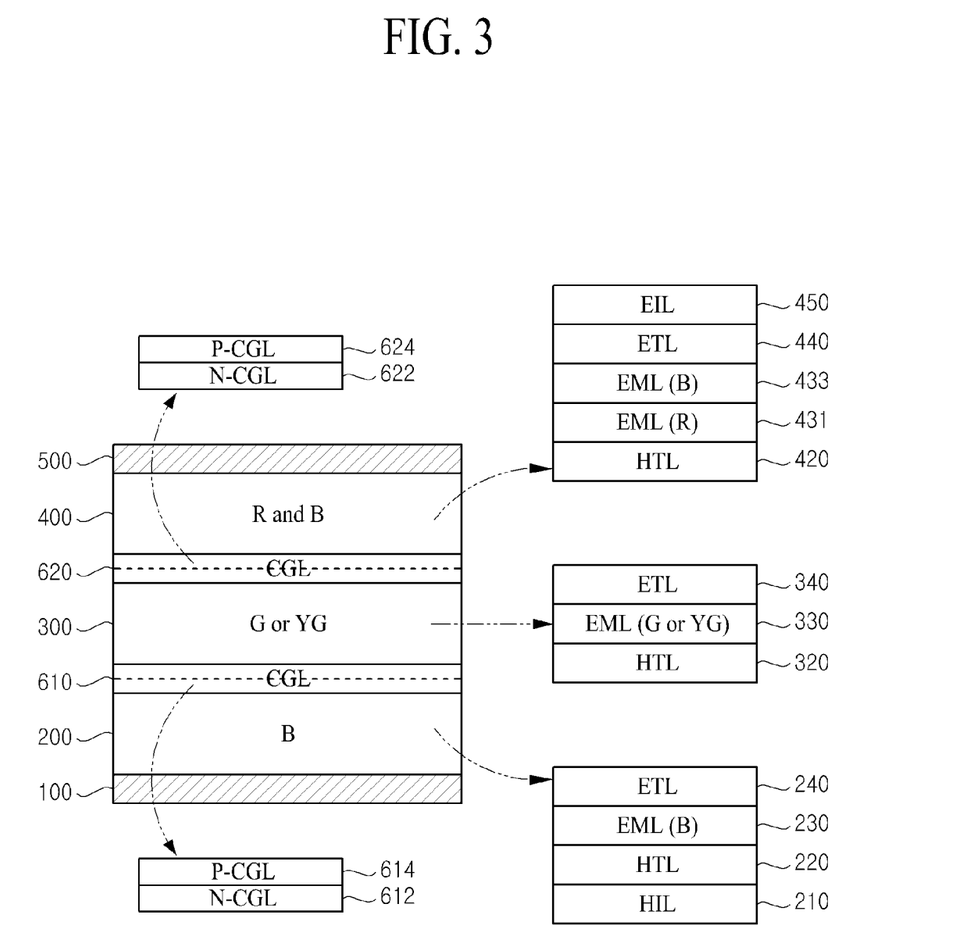
FIG. 3 is a cross-sectional view illustrating an organic light emitting device according to a first exemplary embodiment of the present invention.

FIG. 3 is a brief cross-sectional view illustrating an organic light emitting device according to a first exemplary embodiment of the present invention.

As shown in FIG. 3, the organic light emitting device includes a first electrode 100, a first stack 200, a second stack 300, a third stack 400, a second electrode 500, and charge generating layers 610 and 612.

The first electrode 100 may serve as an anode. The first electrode 100 may be made of, but not limited to, a transparent conductive material having high conductivity and high work function, for example, Indium Tin Oxide (ITO), Indium Zinc Oxide (IZO), $SnO_2$, or ZnO.

The first stack 200 may be formed on the first electrode 100 to emit light of a first color, specifically blue (B) light, which has a short wavelength. The blue (B) light may have a peak wavelength in the range of about 445 nm to about 475 nm.

The first stack 200 may include a hole injecting layer (HIL) 210, a first hole transporting layer (HTL) 220, a first light emitting layer (EML) 230, and a first electron transporting layer (ETL) 240, which are sequentially formed on the first electrode 100.

The hole injecting layer (HIL) 210 may be made of, but not limited to, MTDATA(4,4',4"-tris(3-methylphenylphenylamino)triphenylamine), CuPc(copper phthalocyanine) or PEDOT/PSS(poly(3,4-ethylenedioxythiophene, polystyrene sulfonate).

The first hole transporting layer (HTL) 220 may be made of, but not limited to, TPD(N,N-diphenyl-N,N-bis(3-methylphenyl)-1,1'-bi-phenyl-4,4'-diamine) or NPB(N,N'-di(naphthalen-1-yl)-N,N'-diphenyl-benzidine).

The first light emitting layer (EML) 230 may emit blue (B) light, and may be formed by doping a host material with a blue (B) dopant. The first light emitting layer (EML) 230 may be made of, but not limited to, at least one fluorescent host material doped with a fluorescent blue (B) dopant, wherein the at least one fluorescent host material is selected from a group of an anthracene derivative, a pyrene derivative, and a perylene derivative.

The first electron transporting layer (ETL) 240 may be made of, but not limited to, oxadiazole, triazole, phenanthroline, benzoxazole, or benzthiazole.

The second stack 300 may be formed on the first stack 200 and emits light of a second color, for example green (G) or yellow-green (YG) light, which corresponds to a wavelength longer than that of the blue (B) light. The green (G) light may have a peak wavelength in the range of about 510 nm to about 545 nm, and the yellow-green (YG) light may have a peak wavelength in the range of about 552 nm to about 575 nm.

The second stack 300 may include a second hole transporting layer (HTL) 320, a second light emitting layer (EML) 330, and a second electron transporting layer (ETL) 340, which are sequentially formed on the first stack 200 on the first charge generating layer 610.

The second hole transporting layer (HTL) 320 may be made of, but not limited to, the same material as that of the first hole transporting layer (HTL) 220.

The second light emitting layer (EML) 330 may emit green (G) or yellow-green (YG) light, and may be formed by doping a host material with a green (G) or yellow-green (YG) dopant. The second light emitting layer (EML) 330 may be made of a phosphor host material doped with a phosphor green (G) or yellow-green (YG) dopant, wherein the phosphor host material includes a carbazole-based compound or a metal complex. The carbazole-based compound may include CBP(4,4-N,N'-dicarbazole-biphenyl), CBP derivative, mCP(N,N'-dicarbazolyl-3,5-benzene) or mCP derivative, and the metal complex may include ZnPBO(phenyloxazole) metal complex or ZnPBT(phenylthiazole) metal complex.

The second electron transporting layer (ETL) 340 may be made of, but not limited to, the same material as that of the first electron transporting layer (ETL) 240.

The third stack 400 may be formed on the second stack 300 and emit light of a third color, specifically mixed light of red (R) light which corresponds to a long wavelength and blue (B) light which corresponds to a short wavelength. The red (R) light may have a peak wavelength in the range of about 600 nm to about 625 nm, and the blue (B) light may have a peak wavelength in the range of about 445 nm to about 475 nm.

The third stack 400 may include a third hole transporting layer (HTL) 420, a third light emitting layer (EML) 431, a fourth light emitting layer (EML) 433, a third electron transporting layer (ETL) 440 and an electron injecting layer (EIL) 450, which are sequentially formed on the second stack 300 on the second charge generating layer 620.

The third hole transporting layer (HTL) 420 may be made of, but not limited to, the same material as that of the first hole transporting layer (HTL) 220.

The third light emitting layer (EML) 431 may emit red (R) light, and may be formed by doping a host material with a red (R) dopant. The host material used for the third light emitting layer (EML) 431 may be made of a phosphor host material of a carbazole-based compound or a metal complex in the same manner as the second light emitting layer (EML) 330. The red dopant may be made of, but not limited to, a metal complex of Jr or Pt.

The fourth light emitting layer (EML) 433 may emit blue (B) light, and may be formed by doping a host material with a blue (B) dopant. The fourth light emitting layer (EML) 433 may be made of, but not limited to, at least one fluorescent host material doped with a fluorescent blue (B) dopant, wherein the at least one fluorescent host material is selected from a group of an anthracene derivative, a pyrene derivative and a perylene derivative.

The third electron transporting layer (ETL) 440 may be made of, but not limited to, the same material as that of the first electron transporting layer (ETL) 240.

The electron injecting layer (EIL) 450 may be made of, but not limited to, LIF or LiQ (lithium quinolate).

The second electrode 500 may serve as a cathode. The second electrode 500 may be made of, but not limited to, a metal having low work function, for example, Al, Ag, Mg, Li, or Ca.

The charge generating layers (CGL) 610 and 620 are comprised of a first charge generating layer (CGL) 610 and a second charge generating layer (CGL) 620.

The first charge generating layer (CGL) 610 may be formed between the first stack 200 and the second stack 300, and serve to uniformly control charges between the first stack 200 and the second stack 300. Particularly, the first charge generating layer (CGL) 610 may include an N type first charge generating layer 612 adjacent to the first stack 200, and a P type first charge generating layer 614 adjacent to the second stack 300. The N type first charge generating layer 612 injects electrons to the first stack 200, and the P type first charge generating layer 614 injects holes to the second stack 300.

The second charge generating layer (CGL) 620 may be formed between the second stack 300 and the third stack 400, and serve to uniformly control charges between the second stack 300 and the third stack 400. Particularly, the second charge generating layer (CGL) 620 may include an N type second charge generating layer 622 adjacent to the second stack 300, and a P type second charge generating layer 624 adjacent to the third stack 400. The N type second charge generating layer 622 injects electrons to the second stack 300, and the P type second charge generating layer 624 injects holes to the third stack 400.

The aforementioned organic light emitting device according to a first embodiment of the present invention is characterized in that it includes the first stack 200 emitting blue (B) light, the second stack emitting green (G) or yellow-green (YG) light, and the third stack 400 emitting mixed light of red (R) light and blue (B) light. In more detail, the organic light emitting device according to this embodiment of the present invention has the following advantages.

First, according to this embodiment of the present invention, since the first stack 200 includes the first light emitting layer (EML) 230 emitting blue (B) light and the third stack 400 also includes the fourth light emitting layer (EML) 433 emitting blue (B) light, blue (B) light having relatively low efficiency may be emitted from two stacks, whereby overall light emitting efficiency is improved.

Second, according to this embodiment of the present invention, in the case that blue (B) light is emitted from the two stacks, instead of two stacks emitting blue (B) light only, one first stack 200 emitting blue (B) light only and one third stack 400 emitting blue (B) light and red (R) light together are provided, whereby the number of a total of stacks is not increased. Thus, light emitting efficiency is improved without increasing a driving voltage. In other words, normally stacks respectively emitting blue (B) light, green (G) light, and red (R) light may be required to emit white light. However, if two stacks emitting blue (B) light are provided, a total of four stacks are required, causing a problem in that a driving voltage is increased. By contrast, according to this embodiment of the present invention, since the third stack 400 emitting red (R) light emits red (R) light and blue (B) light together, a total of only three stacks are required, whereby the driving voltage is not increased.

Third, according to this embodiment of the present invention, in the case that one stack emits blue (B) light and light of another color together, the stack is provided to emit blue (B) light and red (R) light together instead of emitting blue (B) light and green (G) or yellow-green (YG) light together. Thus, color viewing angle and white balance characteristics are improved. For example, in the case that the first stack 200 is provided to emit blue (B) light, the second stack 300 is provided to emit blue (B) light and green (G) light together, and the third stack 400 is provided to emit red (R) light, efficiency of green (G) light is deteriorated, and color viewing angle and white balance characteristics are affected relatively by red (R) light. At this time, in case of the display device, remarkable deterioration of picture quality is visualized by a user when an overall color has red (R) based color rather than green (G) based color. Accordingly, in this embodiment of the present invention, the first stack 200 is provided to emit blue (B) light, the second stack 300 is provided to emit green (G) light, and the third stack 400 is provided to emit red (R) light and blue (B) light together, whereby influence by red (R) light is minimized. As a result, color viewing angle and white balance characteristics may be improved more efficiently.

Figure 4:
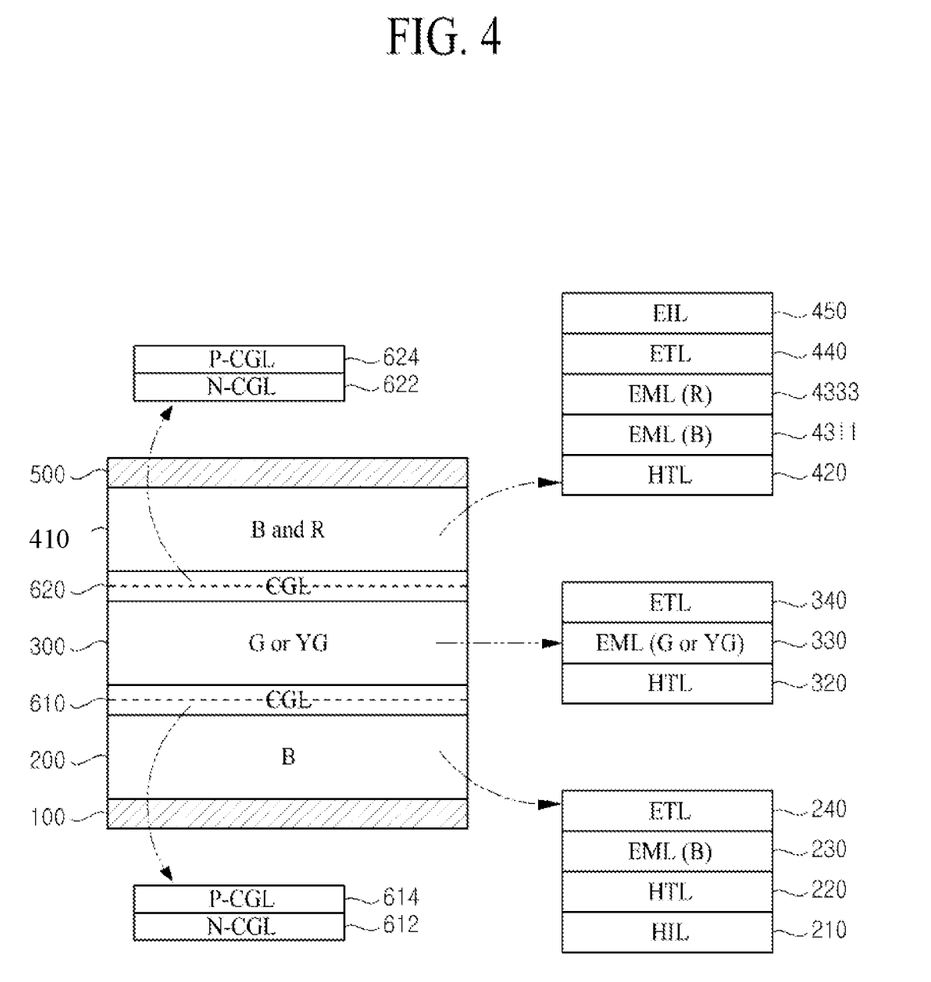
FIG. 4 is a cross-sectional view illustrating an organic light emitting device according to a second exemplary embodiment of the present invention.

FIG. 4 is a brief cross-sectional view illustrating an organic light emitting device according to a second exemplary embodiment of the present invention. The organic light emitting device of FIG. 4 is similar to that of FIG. 3 except that the third stack 410 is changed. Accordingly, the same reference numbers will be used throughout the drawings to refer to the same elements as those of the aforementioned embodiment. Hereinafter, only different elements will be described.

The embodiment of the present invention according to FIG. 4 is different from the embodiment according to FIG. 3 in that characteristics of the third light emitting layer (EML) 4311 and the fourth light emitting layer (EML) 4333 are changed.

In other words, according to FIG. 3, the third light emitting layer (EML) 431 emitting red (R) light and the fourth light emitting layer (EML) 433 emitting blue (B) light are sequentially deposited on the third hole transporting layer (HTL) 420. Here, the third light emitting layer (EML) 431 disposed to be relatively close to the first electrode 100 emits red (R)

light, and the fourth light emitting (EML) layer 433 disposed to be relatively far away from the first electrode 100 emits blue (B) light.

On the other hand, according to FIG. 4, the third light emitting layer (EML) 4311 emitting blue (B) light and the fourth light emitting layer (EML) 4333 emitting red (R) light are sequentially deposited on the third hole transporting layer (HTL) 420. Here, the third light emitting layer (EML) 4311 disposed to be relatively close to the first electrode 100 emits blue (B) light, and the fourth light emitting (EML) layer 4333 disposed to be relatively far away from the first electrode 100 emits red (R) light.

In a structure where white light is emitted through the first electrode 100 as the first electrode 100 serves as anode of a transparent conductive material and the second electrode 500 serves as a cathode of an opaque metal material and the third light emitting layer (EML) 431 disposed to be relatively close to the first electrode 100 emits red (R) light, as shown in FIG. 3, efficiency of red (R) light may be improved.

However, as described above, in case of the display device, it is preferable to minimize that color viewing angle and white balance characteristics are affected by red (R) light. Accordingly, as shown in FIG. 4, the third light emitting layer (EML) 4311 disposed to be relatively close to the first electrode 100 is provided to emit blue (B) light, and the fourth light emitting (EML) layer 4333 disposed to be relatively far away from the first electrode 100 is provided to emit red (R) light.

Meanwhile, based on the fourth light emitting layer (EML) 4333, holes move towards the third electron transporting layer (ETL) 440 while electrons move towards the third light emitting layer (EML) 4311. Accordingly, it is preferable that the fourth light emitting layer (EML) 4333 additionally includes hole transporting and electron transporting characteristics in addition to light emitting characteristics. If the fourth light emitting layer (EML) 4333 is provided to emit red (R) light, as shown in FIG. 4, a phosphor host material for emitting red (R) light may include electron transporting characteristics, whereby hole transporting characteristics may only be complemented for the fourth light emitting layer (EML) 4333. In other words, the fourth light emitting layer (EML) 4333 may be made of a single layer structure deposited with a combination of a first host material having red (R) light emitting and electron transporting characteristics, a second host material having hole transporting characteristic and a red (R) dopant.

In this case, it is preferable that a Lumo (Lowest Unoccupied Molecular Orbital) level gap between the first host material having red (R) light emitting and electron transporting characteristics and the second host material having hole transporting characteristics is no more than about 0.3 eV, and a Homo (Highest Occupied Molecular Orbital) level gap therebetween is no more than about 0.3 eV.

Also, based on the third light emitting layer (EML) 4311, holes move towards the fourth light emitting layer (EML) 4333 and electrons move towards the third hole transporting layer (HTL) 420. Accordingly, it is preferable that the third light emitting layer (EML) 4311 additionally includes hole transporting and electron transporting characteristics in addition to light emitting characteristics. If the third light emitting layer (EML) 4311 is provided to emit blue (B) light, as shown in FIG. 4, a fluorescent host material for emitting blue (B) light may include hole transporting characteristics. Accordingly, electron transporting characteristics may only be complemented for the third light emitting layer (EML) 4311. Namely, the third light emitting layer (EML) 4311 may be made of a single layer structure deposited with a combination of a first host material having blue (B) light emitting and hole transporting characteristics, a second host material having electron transporting characteristics and a blue (B) dopant.

At this time, it is preferable that the first host material having blue (B) light emitting and hole transporting characteristics has a hole transporting capability of at least about $5.0 \times 10^{-3}$ cm$^2$/V·s and a triplet energy gap of at least about 2.3 eV. Also, it is preferable that the second host material having electron transporting characteristics has a Homo (Highest Occupied Molecular Orbital) level of no more than about −5.8 eV and a Lumo (Lowest Unoccupied Molecular Orbital) level of no more than about −2.7 eV.

However, the third light emitting layer (EML) 4311 may be provided to have a function of an exciton blocking layer (EBL) for improving light efficiency by shielding movement of excitons. In this case, it is not required that electron transporting characteristics should be complemented for the third light emitting layer (EML) 4311. Accordingly, if the third light emitting layer (EML) 4311 performs the function of the exciton blocking layer (EBL), the third light emitting layer (EML) 4311 may be made of a single layer structure deposited with a first host material having blue (B) light emitting and hole transporting characteristics and a blue (B) dopant.

As described above, as in FIG. 4, since the fourth light emitting layer (EML) 4333, which includes a phosphor host material having electron transporting characteristics, is disposed to be close to the third electron transporting layer (ETL) 440 and the third light emitting layer (EML) 4311, which includes a fluorescent host material having hole transporting characteristics, is disposed to be close to the third hole transporting layer (HTL) 420, a driving voltage of the device may be lowered, its lifespan may be increased, and light emitting efficiency may be improved.

Also, it is preferable that the third electron transporting layer (ETL) 440 formed on the fourth light emitting layer (EML) 4333 is provided to have the function of the hole blocking layer (HBL), whereby holes fail to move to the electron injecting layer (EIL) 450 formed on the third electron transporting layer (ETL) 440. Accordingly, in order that the third electron transporting layer (ETL) 440 has electron transporting characteristics and additionally has the function of the hole blocking layer (HBL), it is preferable that the third electron transporting layer (ETL) 440 has a Homo level of nor more than about −5.8 eV and a gap between a Lomo level of the third electron transporting layer (ETL) 440 and a Lomo level of the first host material constituting the fourth light emitting layer (EML) 4333 is no more than about 0.2 eV.

According to the structure of FIG. 4, it is preferable that a total thickness of the first stack 200, the second stack 300, the third stack 400 and the charge generating layers 610 and 620 is set to about 200 nm to about 500 nm to optimize cavity characteristics while preventing the thickness from being increased. Particularly, the distance between the first light emitting layer (EML) 230 constituting the first stack 200 and the third light emitting layer (EML) 4311 constituting the third stack 400 may preferably be within the range of about 900 Å to about 1000 Å. Also, a thickness of each of the first light emitting layer (EML) 230, the second light emitting layer (EML) 330, the third light emitting layer (EML) 4311 and the fourth light emitting layer (EML) 4333 may preferably in the range of about 50 Å to about 250 Å, and the third transporting layer (ETL) 440 constituting the third stack 410 may preferably be formed at a thickness of no more than about 500 Å.

Also, it is preferable that Triplet energy of the blue (B) dopant of the third light emitting layer (EML) 4311 is about equal to or greater than that of the red (R) dopant of the fourth light emitting layer (EML) 4333.

Also, each of the first light emitting layer (EML) 230, the second light emitting layer (EML) 330, the third light emitting layer (EML) 4311 and the fourth light emitting layer (EML) 4333 may have a Lumo level in the range of about −2.2 eV to about −3.0 eV and a Homo level in the range of about −5.5 eV to about −6.2 eV.

The following Table 1 illustrates a driving voltage Voled, red (R) light emitting efficiency (cd/A), green (G) light emitting efficiency (cd/A), blue (B) light emitting efficiency (cd/A), white (W) light emitting efficiency (cd/A), panel efficiency (cd/A), and viewing angle variation value, which were measured on the basis of the aforementioned embodiments according to FIGS. 3 and 4.

TABLE 1

|  | Voled | R (cd/A) | G (cd/A) | B (cd/A) | W (cd/A) | Panel efficiency (cd/A) | Viewing angle variation value |
|---|---|---|---|---|---|---|---|
| FIG. 3 | 13.5 | 16.2 | 42.2 | 2.3 | 100.6 | 21.1 | 0.01 |
| FIG. 4 | 12.7 | 9.3 | 41.4 | 2.9 | 90.2 | 29.3 | 0.001 |

From Table 1 above, it is noted that the driving voltage in the embodiment of FIG. 4 is lower than that in the embodiment of FIG. 3, and panel efficiency and viewing angle characteristics in the embodiment of FIG. 4 are improved over those in the embodiment of FIG. 3.

Figure 5:
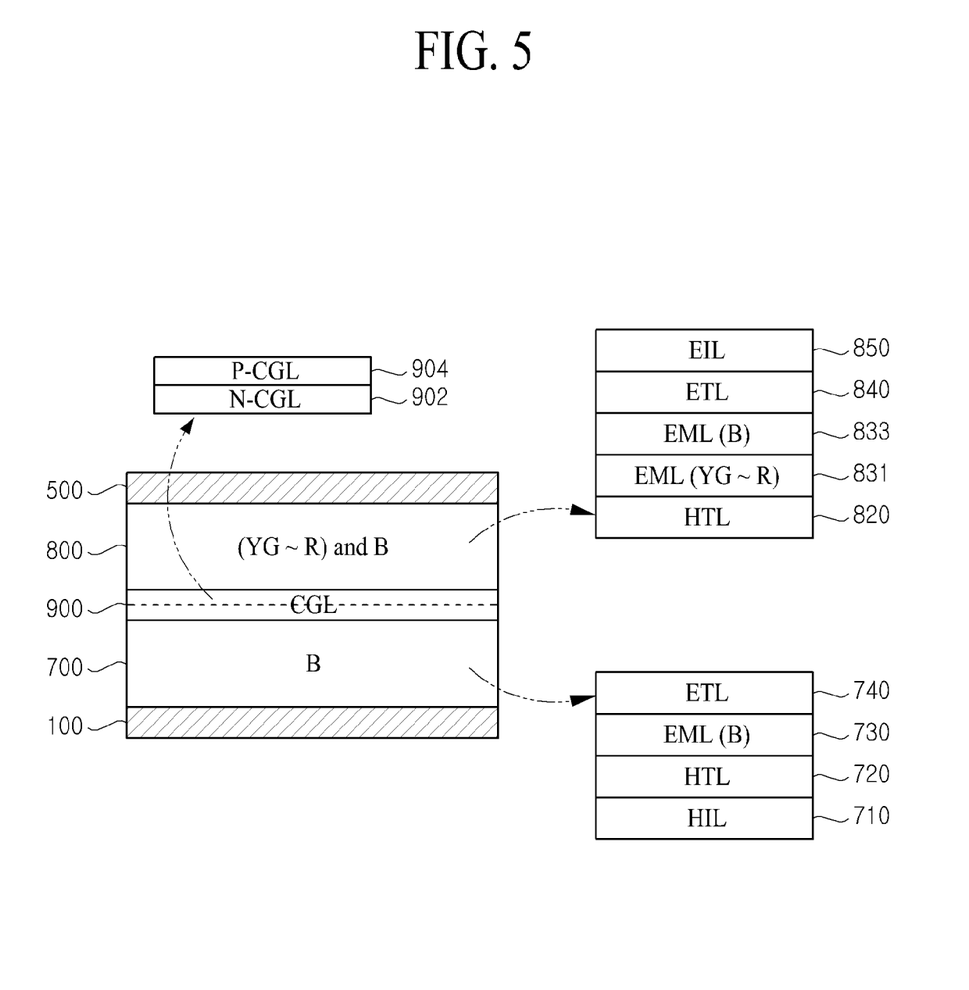
FIG. 5 is a cross-sectional view illustrating an organic light emitting device according to a third exemplary embodiment of the present invention.

FIG. 5 is a brief cross-sectional view illustrating an organic light emitting device according to a third exemplary embodiment of the present invention, and relates to an organic light emitting device that includes two stacks.

As shown in FIG. 5, the organic light emitting device includes a first electrode 100, a first stack 700, a second stack 800, a charge generating layer 900, and a second electrode 500.

The first electrode 100 may serve as an anode, and the second electrode 500 may serve as a cathode. Since the first electrode 100 and the second electrode 500 are made of the same material as that of the first and second electrodes shown in FIGS. 3 and 4, their repeated description will be omitted.

The first stack 700 is formed on the first electrode 100 to emit light of a first color, specifically blue (B) light, which has a short wavelength. The blue (B) light may have a peak wavelength in the range of 445 nm to 475 nm.

The first stack 700 may include a hole injecting layer (HIL) 710, a first hole transporting layer (HTL) 720, a first light emitting layer (EML) 730, and a first electron transporting layer (ETL) 740, which are sequentially formed on the first electrode 100, in the same manner as shown in FIGS. 3 and 4. Detailed elements of each layer are the same as those of FIGS. 3 and 4.

The second stack 800 is formed on the first stack 700 and emits light of a second color, specifically mixed light of yellow-green (YG) to red (R) light, which corresponds to a longer wavelength than that of the light of the first color, and blue (B) light which corresponds to a shorter wavelength. The yellow-green (YG) to red (R) light may have a peak wavelength in the range of about 552 nm to about 625 nm, and the blue (B) light may have a peak wavelength in the range of about 445 nm to about 475 nm.

The second stack 800 may include a second hole transporting layer (HTL) 820, a second light emitting layer (EML) 831, a third light emitting layer (EML) 833, a second electron transporting layer (ETL) 840 and an electron injecting layer (EIL) 850, which are formed on the first stack 700, and sequentially formed on the charge generating layer 900.

The second hole transporting layer (HTL) 820 may be made of the same material as that of the aforementioned third hole transporting layer (HTL) 420 of FIGS. 3 and 4.

The second light emitting layer (EML) 831 may emit yellow-green (YG) to red (R) light, and may be formed by doping a phosphor host material of carbazole based compound or metal complex with a yellow-green (YG) to red (R) dopant.

The third light emitting layer (EML) 833 may emit blue (B) light, and may be formed by doping at least one fluorescent host material selected from a group of an anthracene derivative, a pyrene derivative and a perylene derivative with a blue (B) dopant.

The second electron transporting layer (ETL) 840 may be made of the same material as that of the third electron transporting layer (ETL) 440 of FIGS. 3 and 4.

The electron injecting layer (EIL) 850 may be made of LIF or LiQ (lithium quinolate) in the same manner as described with respect to FIGS. 3 and 4.

The charge generating layer (CGL) 900 may be formed between the first stack 700 and the second stack 800, and serves to uniformly control charges between the first stack 700 and the second stack 800. The charge generating layer (CGL) 900 may include an N type first charge generating layer 902 adjacent to the first stack 700, and a P type first charge generating layer 904 adjacent to the second stack 800.

Since the aforementioned organic light emitting device according to FIG. 5 includes the first stack 700 emitting blue (B) light and the second stack 800 emitting mixed light of yellow-green (YG) to red (R) light and blue (B) light, blue (B) light of which efficiency is relatively low may be emitted from the two stacks, whereby light emitting efficiency may be improved. Also, instead of two stacks respectively emitting blue (B) light only, the first stack 700 emitting blue (B) light only and the second stack 800 emitting blue (B) light and yellow-green (YG) to red (R) light together are combined so as not to increase the number of stacks, whereby light emitting efficiency is improved while the driving voltage is not increased.

Figure 6:
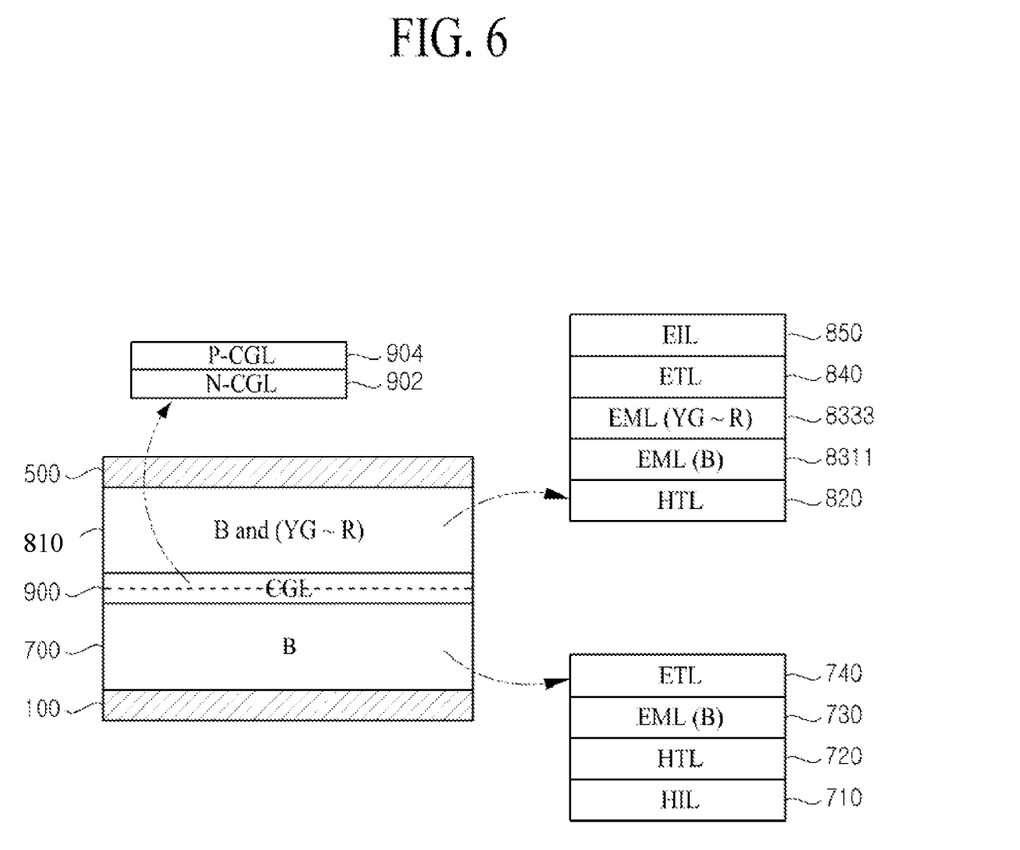
FIG. 6 is a cross-sectional view illustrating an organic light emitting device according to a fourth exemplary embodiment of the present invention.

FIG. 6 is a brief cross-sectional view illustrating an organic light emitting device according to a fourth exemplary embodiment of the present invention. The organic light emitting device of FIG. 6 is similar to that of FIG. 5 except that the second stack 810 is changed. Accordingly, the same reference numbers will be used throughout the drawings to refer to the same elements as those of the aforementioned embodiment. Hereinafter, only different elements will be described.

The embodiment of the present invention according to FIG. 6 is different from the embodiment according to FIG. 5 in that characteristics of the second light emitting layer (EML) 8311 and the third light emitting layer (EML) 8333 are changed.

In other words, according to FIG. 5, the second light emitting layer (EML) 831 emitting yellow-green (YG) to red (R) light and the third light emitting layer (EML) 833 emitting blue (B) light are sequentially deposited on the second hole transporting layer (HTL) 820, whereby the second light emitting layer (EML) 831 disposed to be relatively close to the first electrode 100 emits yellow-green (YG) to red (R) light, and the third light emitting (EML) layer 833 disposed to be relatively far away from the first electrode 100 emits blue (B) light.

On the other hand, according to FIG. 6, the second light emitting layer (EML) 8311 emitting blue (B) light and the third light emitting layer (EML) 8333 emitting yellow-green (YG) to red (R) light are sequentially deposited on the second hole transporting layer (HTL) 820, whereby the second light emitting layer (EML) 8311 disposed to be relatively close to the first electrode 100 emits blue (B) light, and the third light emitting (EML) layer 8333 disposed to be relatively far away from the first electrode 100 emits yellow-green (YG) to red (R) light.

Based on the third light emitting layer (EML) 8333, holes move towards the second electron transporting layer (ETL) 840 while electrons move towards the second light emitting layer (EML) 8311. Accordingly, it is preferable that the third light emitting layer (EML) 8333 additionally includes hole transporting characteristic and electron transporting characteristic in addition to light emitting characteristic. If the third light emitting layer (EML) 8333 is provided to emit yellow-green (YG) to red (R) light as shown in FIG. 6, a phosphor host material for emitting yellow-green (YG) to red (R) light may include electron transporting characteristic, whereby only hole transporting characteristic may be complemented for the third light emitting layer (EML) 8333. In other words, the third light emitting layer (EML) 8333 may be made of a single layer structure deposited with combination of a first host material having yellow-green (YG) to red (R) light emitting and electron transporting characteristics, a second host material having hole transporting characteristics and a yellow-green (YG) to red (R) dopant.

In this case, it is preferable that a Lumo (Lowest Unoccupied Molecular Orbital) level gap between the first host material having yellow-green (YG) to red (R) light emitting and electron transporting characteristics and the second host material having hole transporting characteristics is no more than about 0.3 eV and a Homo (Highest Occupied Molecular Orbital) level gap therebetween is no more than about 0.3 eV.

Also, based on the second light emitting layer (EML) 8311, holes move towards the third light emitting layer (EML) 8333 and electrons move towards the second hole transporting layer (HTL) 820. Accordingly, it is preferable that the second light emitting layer (EML) 8311 additionally includes hole transporting and electron transporting characteristics in addition to light emitting characteristics. If the second light emitting layer (EML) 8311 is provided to emit blue (B) light as shown in FIG. 6, a fluorescent host material for emitting blue (B) light may include hole transporting characteristics. Accordingly, only electron transporting characteristics may be complemented for the second light emitting layer (EML) 8311. Namely, the second light emitting layer (EML) 8311 may be made of a single layer structure deposited with a combination of a first host material having blue (B) light emitting and hole transporting characteristics, a second host material having electron transporting characteristics and a blue (B) dopant.

At this time, it is preferable that the first host material having blue (B) light emitting and hole transporting characteristics has a hole transporting capability of at least about $5.0 \times 10^{-3}$ cm$^2$/V·s and a triplet energy gap of at least about 2.3 eV. Also, it is preferable that the second host material having electron transporting characteristic has a Homo (Highest Occupied Molecular Orbital) level of no more than about −5.8 eV and a Lumo (Lowest Unoccupied Molecular Orbital) level of no more than about −2.7 eV.

However, the second light emitting layer (EML) 8311 may be provided to have a function of an exciton blocking layer (EBL) for improving light efficiency by shielding movement of excitons. In this case, it is not required that electron transporting characteristics should be complemented for the second light emitting layer (EML) 8311. Accordingly, if the second light emitting layer (EML) 8311 performs the function of the exciton blocking layer (EBL), the second light emitting layer (EML) 8311 may be made of a single layer structure deposited with a first host material having blue (B) light emitting and hole transporting characteristics and a blue (B) dopant.

As described above, with respect to FIG. 6, since the third light emitting layer (EML) 8333, which includes a phosphor host material having electron transporting characteristics, is disposed to be close to the second electron transporting layer (ETL) 840 and the second light emitting layer (EML) 8311, which includes a fluorescent host material having hole transporting characteristics, is disposed to be close to the second hole transporting layer (HTL) 820, a driving voltage of the device may be lowered, its lifespan may be increased, and light emitting efficiency may be improved.

Also, it is preferable that the second electron transporting layer (ETL) 840 formed on the third light emitting layer (EML) 8333 is provided to have the function of the hole blocking layer (HBL), whereby holes fail to move to the electron injecting layer (EIL) 850 formed on the second electron transporting layer (ETL) 840. Accordingly, in order that the second electron transporting layer (ETL) 840 basically has electron transporting characteristics and additionally has the function of the hole blocking layer, it is preferable that the second electron transporting layer (ETL) 840 has a Homo level of no more than about −5.8 eV and a gap between a Lomo level of the second electron transporting layer (ETL) 840 and a Lomo level of the first host material constituting the third light emitting layer (EML) 833 is nor more than about 0.2 eV.

It is preferable that Triplet energy of the blue (B) dopant of the second light emitting layer (EML) 8311 is equal to or greater than that of a yellow-green (YG) to red (R) dopant of the third light emitting layer (EML) 8333.

Also, each of the first light emitting layer (EML) 730, the second light emitting layer (EML) 8311 and the third light emitting layer (EML) 8333 may have a Lumo level in the range of about −2.2 eV to about −3.0 eV and a Homo level in the range of about −5.5 eV to about −6.2 eV.

The following Table 2 illustrates a driving voltage Voled, red (R) light emitting efficiency (cd/A), green (G) light emitting efficiency (cd/A), blue (B) light emitting efficiency (cd/A), white (W) light emitting efficiency (cd/A), panel efficiency (cd/A), and viewing angle variation value, which are measured on the basis of the aforementioned embodiment according to FIG. 5 and the aforementioned embodiment according to FIG. 6.

TABLE 2

|  | Voled | R (cd/A) | G (cd/A) | B (cd/A) | W (cd/A) | Panel efficiency (cd/A) | Viewing angle variation value |
|---|---|---|---|---|---|---|---|
| FIG. 5 | 8.1 | 7.9 | 32.8 | 2.3 | 75.9 | 28.5 | 0.014 |
| FIG. 6 | 8.0 | 8.4 | 30.2 | 2.8 | 71.9 | 29.3 | 0.001 |

From Table 2 above, it is noted that panel efficiency and viewing angle characteristics in the embodiment of FIG. 6 are more improved than those in the embodiment of FIG. 5.

Figure 7:
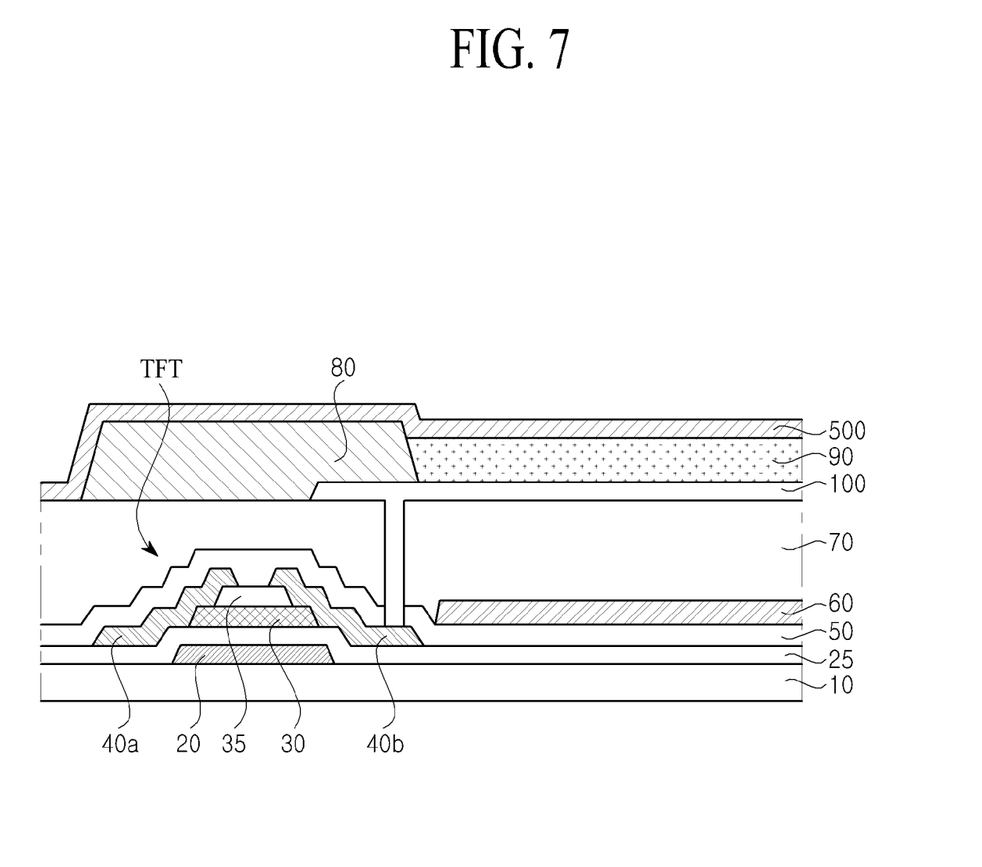
FIG. 7 is a cross-sectional view illustrating a display device according to a fifth exemplary embodiment of the present invention.

FIG. 7 is a brief cross-sectional view illustrating a display device according to a fifth exemplary embodiment of the present invention, and relates to a full color display device provided by combination of the organic light emitting device according to the aforementioned embodiments with a color filter.

As shown in FIG. 7, in the display device, a thin film transistor (TFT) is formed on a substrate 10, and the organic light emitting device is electrically connected with the thin film transistor (TFT).

In more detail, the display device includes a substrate 10, a gate electrode 20, a gate insulating film 25, an active layer 30, an etch stopper 35, a source electrode 40a, a drain electrode 40b, a passivation film 50, a color filter 60, a planarization layer 70, a bank layer 80, and an organic light emitting device.

The gate electrode 20 is patterned on the substrate 10, and the gate insulating film 25 is formed on an entire surface of the substrate including the gate electrode 20. The gate electrode 20 may be made of metal such as Mo, Al, Cr, Au, Ti, Ni, Nd, or Cu, and the gate insulating film 25 may be made of an inorganic insulating material such as silicon oxide or silicon nitride.

The active layer 30 is patterned on the gate insulating film 25, and the etch stopper 35 is patterned on the active layer 30, whereby a channel region of the active layer 30 is prevented from being etched during an etching process for patterning the source electrode 40a and the drain electrode 40b. The active layer 30 may be made of a silicon based semiconductor, or an oxide semiconductor such as ITZO, IZO, ZnO, or In—Ga—Zn—O(IGZO).

The source electrode 40a and the drain electrode 40b are patterned on two sides of the etch stopper 35. The source electrode 40a and the drain electrode 40b may be made of metal such as Mo, Al, Cr, Au, Ti, Ni, Nd, or Cu.

The passivation film 50 is formed on the source electrode 40a and the drain electrode 40b, and the color filter 60 is patterned on the passivation film 50. The passivation film 50 may be made of an inorganic insulating material such as silicon oxide or silicon nitride. The color filter 60 is formed to overlap a light emitting portion 90 of the organic light emitting device, whereby light emitted from the light emitting portion 90 may be emitted towards the substrate 10 through the color filter 60. This color filter 60 may include at least one of a red color filter, a green color filter, and a blue color filter, which are formed to be identified from one another for each pixel.

The planarization layer 70 is formed on the color filter 60. The planarization layer 70 may be made of an organic insulating material such as photo acryl or BCB.

The bank layer 80 is formed on the planarization layer 70. In more detail, the bank layer 80 is patterned to overlap the thin film transistor (TFT), and a light emitting region is defined by the bank layer 80. The bank layer 80 may be made of an organic insulating material, for example, polyimide, photo acryl, or BCB.

The organic light emitting device includes a first electrode 110, a light emitting portion 90, and a second electrode 120. Similar to that shown and described with respect to FIGS. 3 to 6, the first electrode 110 serves as an anode, and the second electrode 120 serves as a cathode. Also, various modifications may be made in the light emitting portion 90, which is formed between the first electrode 110 and the second electrode 120, and the repeated description of the light emitting portion 90 will be omitted.

Although the display device to which the organic light emitting device is applied has been described as above, the organic light emitting device may be applied to display devices of various structures. Also, the organic light emitting device may be applied to various devices known in the art, for example, lighting equipment, without being limited to the display device only.

According to the embodiments described above, the following advantages may be obtained.

Since the organic light emitting device includes a stack emitting blue (B) light and a stack emitting mixed light of yellow-green to red (R) light and blue (B) light, blue (B) light of which efficiency is relatively low may be emitted from the two stacks, whereby overall light emitting efficiency is improved.

Also, instead of two stacks respectively emitting blue (B) light only, one stack emitting blue (B) light only and one stack emitting blue (B) light and yellow-green (YG) to red (R) light together are combined so as not to increase the number of stacks, whereby light emitting efficiency is improved while the driving voltage is not being increased.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting device comprising:
an anode;
a cathode; and
a plurality of light emitting stacks on top of each other between the anode and the cathode, the plurality of light emitting stacks respectively emitting light of colors different from each another,
wherein the plurality of light emitting stacks include a first stack including a light emitting layer emitting a first blue light and a second stack including a light emitting layer emitting a second blue light and a yellow-green to red light,
wherein the first stack is closest to the anode, and the second stack is closest to the cathode,
wherein, in the second stack, the light emitting layer emitting the second blue light and the yellow-green to red light includes a light emitting layer emitting the second blue light and a separate light emitting layer emitting the yellow-green to red light, and
wherein the light emitting layer emitting the yellow-green to red light includes a first host material having yellow-green to red light emitting and electron transporting characteristics, a second host material having hole transporting characteristics, and a yellow-green to red dopant.

2. The organic light emitting device of claim 1, and wherein, in the second stack, the light emitting layer emitting the second blue light is closer to the anode than the light emitting layer emitting yellow-green to red light.

3. The organic light emitting device of claim 2, wherein a Lumo (Lowest Unoccupied Molecular Orbital) level gap between the first host material and the second host material is no more than 0.3 eV, and a Homo (Highest Occupied Molecular Orbital) level gap between the first host material and the second host material is no more than 0.3 eV.

4. The organic light emitting device of claim 2, wherein, in the second stack, the light emitting layer emitting the second blue light includes a third host material having blue light emitting and hole transporting characteristics, a fourth host material having electron transporting characteristics, and a blue (B) dopant.

5. The organic light emitting device of claim 4, wherein the third host material has a hole transporting capability of at least $5.0 \times 10^{-3}$ cm$^2$/V·s and a triplet energy gap of at least about 2.3 eV, and the fourth host material has a Homo (Highest Occupied Molecular Orbital) level of no more than −5.8 eV and a Lumo (Lowest Unoccupied Molecular Orbital) level of no more than −2.7 eV.

6. The organic light emitting device of claim 1, wherein an electron transporting layer and an electron injecting layer are sequentially formed on the light emitting layer emitting the yellow-green to red light, the electron transporting layer has a function of a hole blocking layer (HBL) so as not to move holes to the electron injecting layer, a Homo level of the electron transporting layer is no more than −5.8 eV, and a gap between a Lomo level of the electron transporting layer and a Lumo level of the first and the second host materials constituting the light emitting layer emitting the yellow-green to red light is no more than 0.2 eV.

7. The organic light emitting device of claim 1, wherein a charge generating layer is between the first stack and the second stack.

8. The organic light emitting device of claim 1, wherein the anode comprises a material selected from the group consisting of indium tin oxide (ITO), indium zinc oxide (IZO), SnO2, and ZnO.

9. The organic light emitting device of claim 1, wherein the cathode comprises a material selected from the group consisting of Al, Ag, Mg, Li, and Ca.

10. An organic light emitting device comprising:
    an anode;
    a cathode;
    a plurality of light emitting stacks on top of each other between the anode and the cathode,
    wherein the plurality of stacks include a first stack including a light emitting layer emitting a first blue light and a second stack including a plurality of light emitting layers emitting a second blue light and a red light,
    wherein the first stack is closest to the anode, and the second stack is closest to the cathode,
    wherein, in the second stack, the plurality of light emitting layers includes a light emitting layer emitting the second blue light and a light emitting layer emitting the red light, and
    wherein the light emitting layer emitting red light includes a first host material having red light emitting and electron transporting characteristics, a second host material having hole transporting characteristics, and a red dopant.

11. The organic light emitting device of claim 10, wherein, in the second stack, the light emitting layer emitting the second blue light is closer to the anode than the light emitting layer emitting the red light.

12. The organic light emitting device of claim 10, further comprising:
    a third stack emitting green or yellow-green light between the first stack and the second stack, and
    a first charge generating layer between the first stack and the third stack, and
    a second charge generating layer between the third stack and the second stack.

13. The organic light emitting device of claim 12, wherein a total thickness of the first stack, the first charge generating layer, the third stack, the second charge generating layer, and the second stack is 200 nm to 500 nm, and
    wherein a distance between the light emitting layer emitting the first blue light and the light emitting layer emitting the second blue light is in the range of 900 Å to 1000 Å.

* * * * *